US008334968B2

(12) United States Patent
Tsujita et al.

(10) Patent No.: US 8,334,968 B2
(45) Date of Patent: Dec. 18, 2012

(54) RECORDING MEDIUM STORING PROGRAM FOR DETERMINING EXPOSURE PARAMETER, EXPOSURE METHOD, AND METHOD OF MANUFACTURING DEVICE

(75) Inventors: Kouichirou Tsujita, Utsunomiya (JP); Koji Mikami, Nikko (JP)

(73) Assignee: Canon Kabushiki Kaisha, Tokyo (JP)

( * ) Notice: Subject to any disclaimer, the term of this patent is extended or adjusted under 35 U.S.C. 154(b) by 643 days.

(21) Appl. No.: 12/480,660

(22) Filed: Jun. 8, 2009

(65) Prior Publication Data
US 2009/0310116 A1  Dec. 17, 2009

(30) Foreign Application Priority Data
Jun. 11, 2008  (JP) .................................. 2008-153398

(51) Int. Cl.
*G03B 27/52* (2006.01)
(52) U.S. Cl. ................. 355/77; 355/50; 355/53; 355/67
(58) Field of Classification Search .................. 355/50, 355/52, 53, 55, 67, 77
See application file for complete search history.

(56) References Cited

U.S. PATENT DOCUMENTS

| | | | |
|---|---|---|---|
| 5,558,963 A | 9/1996 | Tsudaka et al. | |
| 5,723,235 A | 3/1998 | Tsudaka et al. | |
| 6,401,236 B1 * | 6/2002 | Baggenstoss et al. | 716/52 |
| 7,342,646 B2 * | 3/2008 | Shi et al. | 355/77 |
| 7,512,927 B2 * | 3/2009 | Gallatin et al. | 716/51 |
| 7,636,910 B2 * | 12/2009 | Arisawa et al. | 716/52 |
| 8,056,022 B2 * | 11/2011 | Robles et al. | 716/52 |
| 8,065,636 B2 * | 11/2011 | Ye et al. | 716/50 |
| 2003/0219154 A1 | 11/2003 | Medvedeva et al. | |
| 2004/0156030 A1 * | 8/2004 | Hansen | 355/67 |
| 2006/0206851 A1 * | 9/2006 | Van Wingerden et al. | 716/19 |
| 2007/0032896 A1 | 2/2007 | Ye et al. | |
| 2007/0196747 A1 | 8/2007 | Granik et al. | |
| 2008/0127027 A1 * | 5/2008 | Gallatin et al. | 716/19 |
| 2009/0310116 A1 * | 12/2009 | Tsujita et al. | 355/77 |

FOREIGN PATENT DOCUMENTS

| | | |
|---|---|---|
| EP | 1635222 A | 3/2006 |
| JP | 7-175204 A | 7/1995 |
| JP | 2000-277426 A | 10/2000 |
| JP | 2007-027418 A | 2/2007 |
| JP | 2007-158328 A | 6/2007 |

OTHER PUBLICATIONS

Koichiro Tsujita et al., Illumination Optimization with Actual Information of Exposure Tool and Resist Process, Optical Microlithography XX, Proc. of SPIE vol. 6520, 652036-1, XP-002541508.

* cited by examiner

*Primary Examiner* — Thomas R Artman
(74) *Attorney, Agent, or Firm* — Canon, U.S.A., Inc. IP Division

(57) ABSTRACT

An exposure method comprises setting an exposure condition using a value of an exposure parameter when plural types of patterns are transferred onto a substrate. The method of determining a value of an exposure parameter comprises calculating an optical image, formed on an image plane upon illuminating a pattern on an object plane, for each of combinations of plural values of an exposure parameter and plural values of at least one of an exposure amount and a defocus amount, calculating, for each of the plural values of the exposure parameter, a deviation between a contour of a target optical image and a calculated contour of the optical image, in each of the plural types of patterns, and determining a value of the exposure parameter, at which a maximum value of the deviations among the plural types of patterns is minimum, as a value of the exposure parameter when exposing the substrate.

5 Claims, 16 Drawing Sheets

| | NA | | | OUTER σ | | | INNER σ | | |
|---|---|---|---|---|---|---|---|---|---|
| | 0.81 | 0.83 | 0.85 | 0.85 | 0.90 | 0.93 | 0.47 | 0.54 | 0.62 |
| 1 | | | | | | @ | | | @ |
| 2 | | @ | | | | @ | | @ | |
| 3 | | | @ | | | @ | @ | | |
| 4 | @ | | | | | @ | | | @ |
| 5 | | | | | @ | | | | @ |
| 6 | | | @ | | | | | | @ |
| 7 | | | | @ | | | | | @ |

FIG. 14

| DEVIATION RMS VALUE [nm] | OUTER σ | INNER σ |
|---|---|---|
| 3.16 | 0.915 | 0.889 |
| 3.63 | 0.938 | 0.857 |
| 5.19 | 0.938 | 0.798 |
| 6.88 | 0.938 | 0.693 |
| 11.7 | 0.8 | 0.5 |

EXECUTION ↑

FIG. 15

| DOF RMS VALUE [nm] | OUTER σ | INNER σ |
|---|---|---|
| 173 | 0.68 | 0.637 |
| 165 | 0.68 | 0.58 |
| 130 | 0.82 | 0.58 |

EXECUTION ↑

FIG. 21

| PATTERN | MEMORY CELL | | | ARRAY CIRCUIT | | | PERIPHERAL CIRCUIT | | |
|---|---|---|---|---|---|---|---|---|---|
| EVALUATION POSITION | 1 | 2 | 3 | 1 | 2 | 3 | 1 | 2 | 3 |
| MATCHING ERROR | 1.0 | 0.8 | 0.7 | 3.5 | 1.1 | 0.9 | 1.2 | 1.0 | 0.9 |

RECORDING MEDIUM STORING PROGRAM FOR DETERMINING EXPOSURE PARAMETER, EXPOSURE METHOD, AND METHOD OF MANUFACTURING DEVICE

BACKGROUND OF THE INVENTION

1. Field of the Invention

The present invention relates to a recording medium storing a computer program for determining an exposure parameter, an exposure method, and a method of manufacturing a device.

2. Description of the Related Art

In the field of semiconductor manufacturing lithography, predetermined patterning is performed using a reticle. To expand the production volume, an exposure apparatus is often newly introduced.

The model of the newly introduced exposure apparatus may be the same as or different from the conventional exposure apparatus. When a new exposure apparatus is introduced, there arises a need for an operation for enabling the exposure apparatus to form the same pattern as the conventional pattern on a substrate using the conventional reticle. This operation is commonly called pattern matching.

Exposure parameters which have the greatest influence on the pattern shape on the substrate are the illumination condition of the reticle and the numerical aperture (NA) and aberration of the projection optical system. Naturally, first, such exposure parameters for the new exposure apparatus are set to the same values as those for the conventional exposure apparatus. However, if the new and old exposure apparatuses are of different types, a definition which represents the illumination condition differs between them. In this case, the same illumination condition is not obtained despite the use of the same numeric representation, making it impossible to form the same pattern. The same applies to the NA, but the difference in definition between the new and old exposure apparatuses in this respect is too small to be really problematic. The aberration also influences the pattern shape, but a leading-edge exposure apparatus has less aberration and its contribution is therefore negligible. Accordingly, although it is a common practice to achieve the object of pattern matching by adjusting the illumination condition, it is not easy to obtain high matching accuracy.

The conventional pattern matching method will be explained below. The illumination condition, the exposure amount, and the defocus amount (typically, a best focus position) are specified, and the contour of the reticle pattern on the substrate is calculated. The RMS (Root Mean Square) value or maximum value of the differences between target values and calculated values at a plurality of pattern matching positions is obtained and the obtained value is set as an index value. FIG. 3 illustrates one example of this method. The target values, the calculated values, and the plurality of pattern matching positions are indicated by dotted lines, solid lines, and alternate long and short dashed lines, respectively.

Next, the illumination condition is slightly changed while keeping the exposure amount and the defocus amount the same, and an index value is obtained. By repeating this sequence in the space to set the illumination condition, an illumination condition under which the index value is minimum is obtained.

The conventional pattern matching method can ensure high pattern matching accuracy as long as the exposure amount and the defocus amount do not fluctuate. However, because the exposure parameter is optimized at a limited exposure amount and defocus amount, the degrees of freedom of the exposure amount and defocus amount may be insufficient under the illumination condition obtained in this way.

SUMMARY OF THE INVENTION

The present invention provides a method of determining the value of an exposure parameter suited to an exposure apparatus which uses a plurality of patterns having different features.

The present invention also provides a method of determining the value of an exposure parameter which is less subject to fluctuations in the exposure amount and/or the defocus amount.

According to the first aspect of the present invention, there is provided an exposure method of exposing an image of a pattern of a reticle onto a substrate by exposure via a projection optical system, the method comprising setting an exposure condition using a value of an exposure parameter determined using a method of determining the value of the exposure parameter when a plurality of types of patterns formed on the reticle are transferred onto the substrate by exposure, and exposing the substrate under the set exposure condition, wherein the method of determining the value of the exposure parameter comprises the steps of calculating an optical image, which is formed on an image plane of the projection optical system upon illuminating a pattern on an object plane of the projection optical system, for each of combinations of a plurality of values of an exposure parameter and a plurality of values of at least one of an exposure amount and a defocus amount, calculating, for each of the plurality of values of the exposure parameter, a deviation between a contour of a target optical image and a contour of the optical image, calculated in the calculating step, in each of the plurality of types of patterns, and determining a value of the exposure parameter, at which a maximum value of the deviations of the contours of the optical images among the plurality of types of patterns is minimum, as a value of the exposure parameter when exposing the substrate.

According to the second aspect of the present invention, there is provided a recording medium storing a computer program for causing a computer to determine a value of an exposure parameter when a plurality of types of patterns formed on a reticle are transferred onto a substrate by exposure, the program comprising the steps of, calculating an optical image, which is formed on an image plane of a projection optical system upon illuminating a pattern on an object plane of the projection optical system, for each of combinations of a plurality of values of an exposure parameter and a plurality of values of at least one of an exposure amount and a defocus amount, calculating, for each of the plurality of values of the exposure parameter, a deviation between a contour of a target optical image and a contour of the optical image, calculated in the calculating step, in each of the plurality of types of patterns, and determining a value of the exposure parameter, at which a maximum value of the deviations of the contours of the optical images among the plurality of types of patterns is minimum, as a value of the exposure parameter when exposing the substrate.

According to the third aspect of the present invention, there is provided an exposure method of exposing an image of a pattern of a reticle onto a substrate by exposure via a projection optical system, the method comprising setting an exposure condition using a value of an exposure parameter determined using a method of determining the value of the exposure parameter when a pattern of the reticle is transferred onto the substrate by exposure, and exposing the substrate under the set exposure condition, wherein the method of determining the value of the exposure parameter comprises the steps of calculating an optical image, which is formed on an image plane of the projection optical system upon illuminating a pattern on an object plane of the projection optical system, for each of combinations of a plurality of values of an exposure parameter and a plurality of values of at least one of an exposure amount and a defocus amount, obtaining a range, of the values of at least one of the exposure amount and the defocus amount, within which a deviation between a contour of a target optical image and a contour of the optical image calculated in the calculating step is not more than an allowable value, for each of the plurality of values of the exposure parameter, and determining a final value of the exposure parameter based on the range obtained for each of the plurality of values of the exposure parameter.

According to the first and second aspects of the present invention, it is possible to determine the value of an exposure parameter suited to an exposure apparatus which uses a plurality of patterns having different features.

According to the third aspect of the present invention, it is possible to provide a method of determining the value of an exposure parameter which is less subject to fluctuations in the exposure amount and/or the defocus amount.

Further features of the present invention will become apparent from the following description of exemplary embodiments with reference to the attached drawings.

BRIEF DESCRIPTION OF THE DRAWINGS

FIG. 14 is a table illustrating an example of the conventional pattern matching;

FIG. 15 is a table illustrating an example of pattern matching according to the first embodiment;

FIG. 21 is a table illustrating an example of the conventional pattern matching;

DESCRIPTION OF THE EMBODIMENTS

Figure 22:
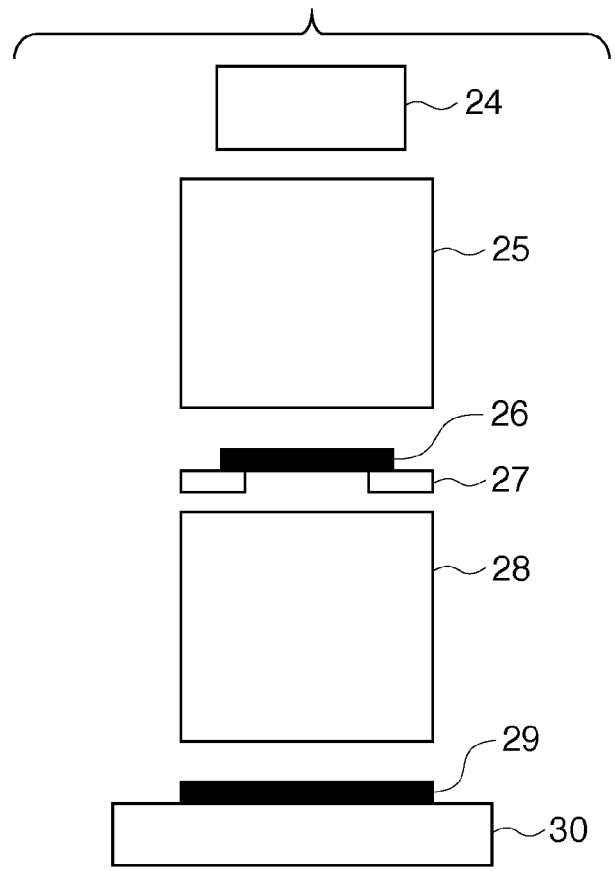
FIG. 22 is a view showing an exposure apparatus.

An exposure apparatus used in a first embodiment includes a light source (e.g., a laser) 24, an illumination system 25, a reticle stage 27 which holds a reticle 26, a projection optical system 28, and a substrate stage 30 which holds a substrate 29, as shown in FIG. 22. The reticle 26 is positioned on the object plane of the projection optical system 28, whereas the substrate 29 is positioned on the image plane of the projection optical system 28.

Figure 2:
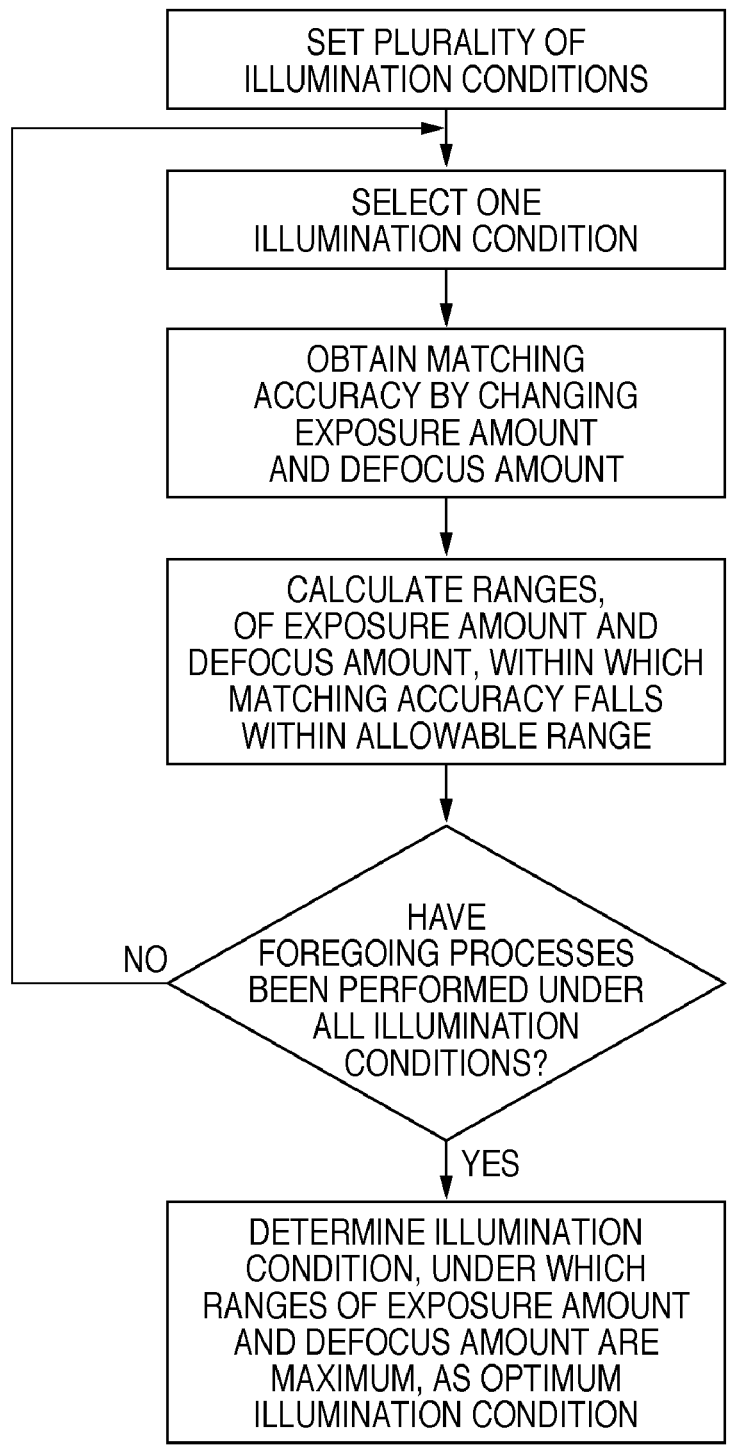
FIG. 2 is a flowchart showing a pattern matching method according to the first embodiment.
Figure 3:
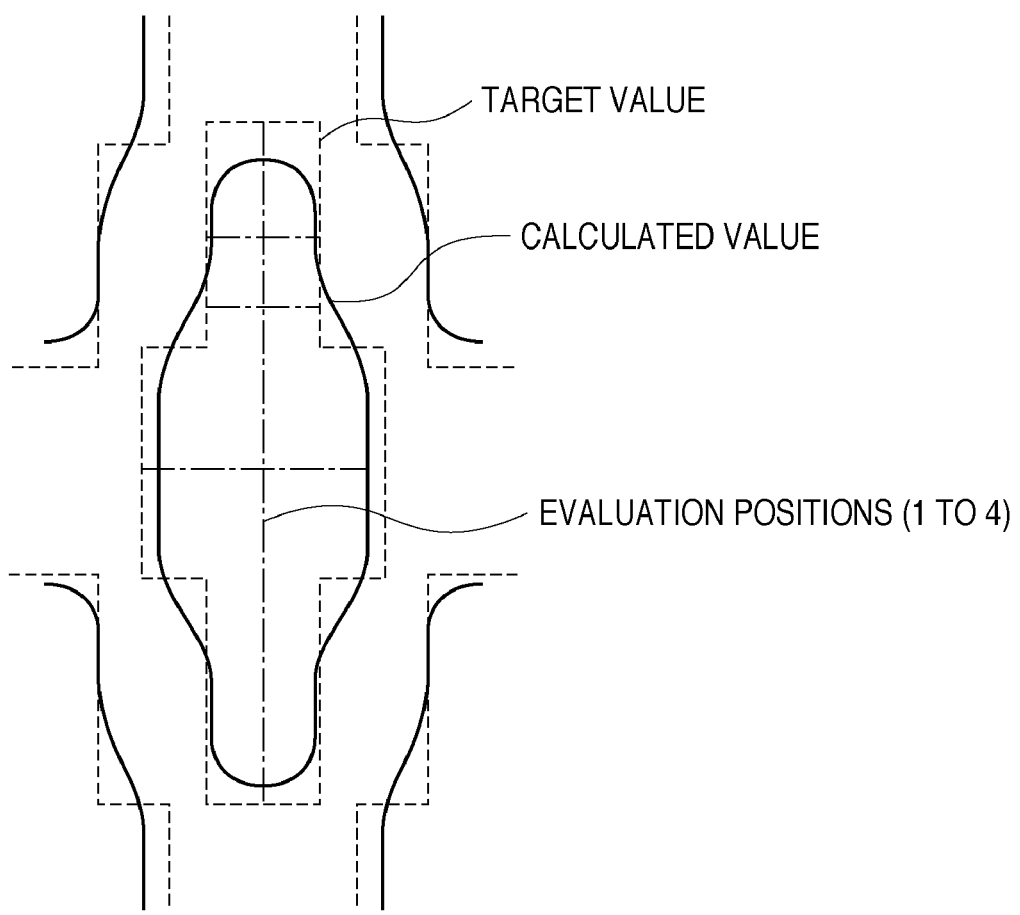
FIG. 3 is a view for explaining the calculated value and target value of the pattern contour.

FIG. 2 is a flowchart showing a pattern matching method according to the first embodiment. In this embodiment, an exposure parameter which can be set for the exposure apparatus when exposing the substrate 29 is the illumination condition. In addition, numeric representation target factors which influence the exposure result of the substrate 29 are the exposure amount and the defocus amount. While the illumination condition, the exposure amount, and the defocus amount are specified, the test reticle 26 is positioned on the object plane of the projection optical system 28 to calculate a test pattern contour (calculated value) formed on the substrate 29 upon illuminating the reticle 26. This process is an obtaining process of obtaining an optical image of the test pattern formed on the image plane of the projection optical system 28. The numerical aperture (NA) and aberration of the projection optical system 28 can also be used as exposure parameters.

Figure 1:
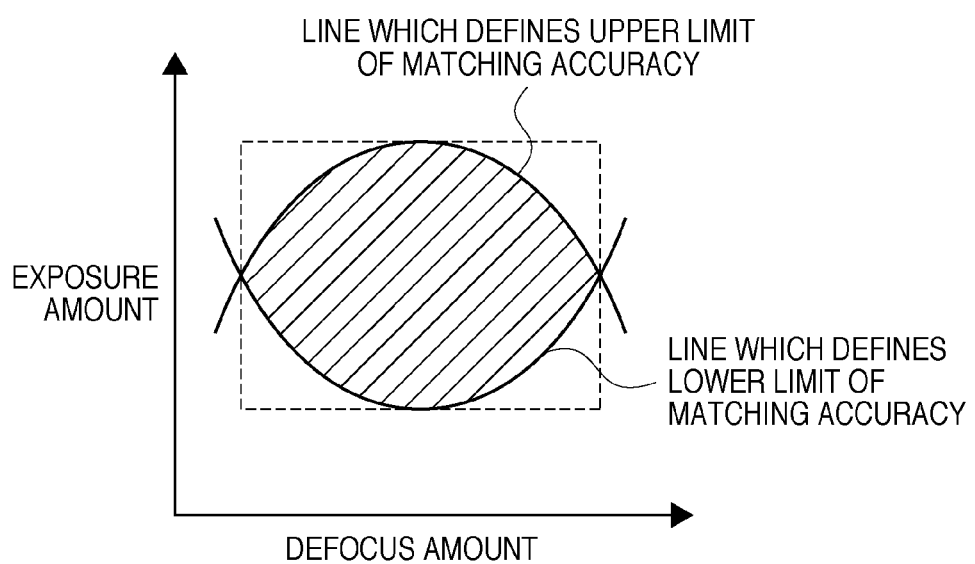
FIG. 1 is a graph for explaining how to obtain a matching window.

The RMS value or maximum value of the differences between the calculated values and the contours (target values) of target optical images of patterns to be formed on the image plane at a plurality of pattern matching positions is obtained. At least one of the exposure amount and the defocus amount is changed while keeping the illumination condition the same to obtain the ranges, of the exposure amount and/or the defocus amount, within which the RMS value or the maximum value is equal to or less than an allowable value. This range is indicated by a hatched region in FIG. 1. In this example, both the exposure amount and the defocus amount are changed. This process is a calculation process of calculating the factor value ranges within which a deviation between the contour of a target optical image to be formed on the image plane and that of the obtained optical image is equal to or less than an allowable value.

At least one of the total area of the change amount ranges of the exposure amount and defocus amount, the area of a rectangle which is inscribed in this range, the abscissa variable (the range of the defocus amount at an optimum exposure amount), and the ordinate variable (the range of the exposure amount at a best focus position) is obtained and the obtained value is set as an index value. This index value will be referred to as a matching window for the sake of convenience of description to be given hereinafter.

The illumination condition is slightly changed, and an index value is obtained. By this process, the above-mentioned obtaining process has been performed for combinations of a plurality of values of the exposure parameter and a plurality of values of the factors. The above-mentioned calculation process of calculating the factor value ranges has also been performed for a plurality of values of the exposure parameter.

By repeating this sequence in the space to set the illumination condition, an illumination condition under which the index value is maximumal is obtained. This process is a determination process of determining, based on the factor value ranges, the value of the exposure parameter to be set for the exposure apparatus. A genetic algorithm, a Monte Carlo method, or the like can be used in the setting of illumination conditions.

Details of the pattern matching method will be explained next. Pattern information for pattern matching is obtained from graphic files, in, for example, the GDS format, which include this pattern information. One graphic file may include all of a plurality of graphics. Alternatively, a plurality of files may be loaded by storing few graphics per file. Since the calculation time increases in proportion to the square of the calculation area, the latter approach requires only a shorter calculation time.

Figure 4:
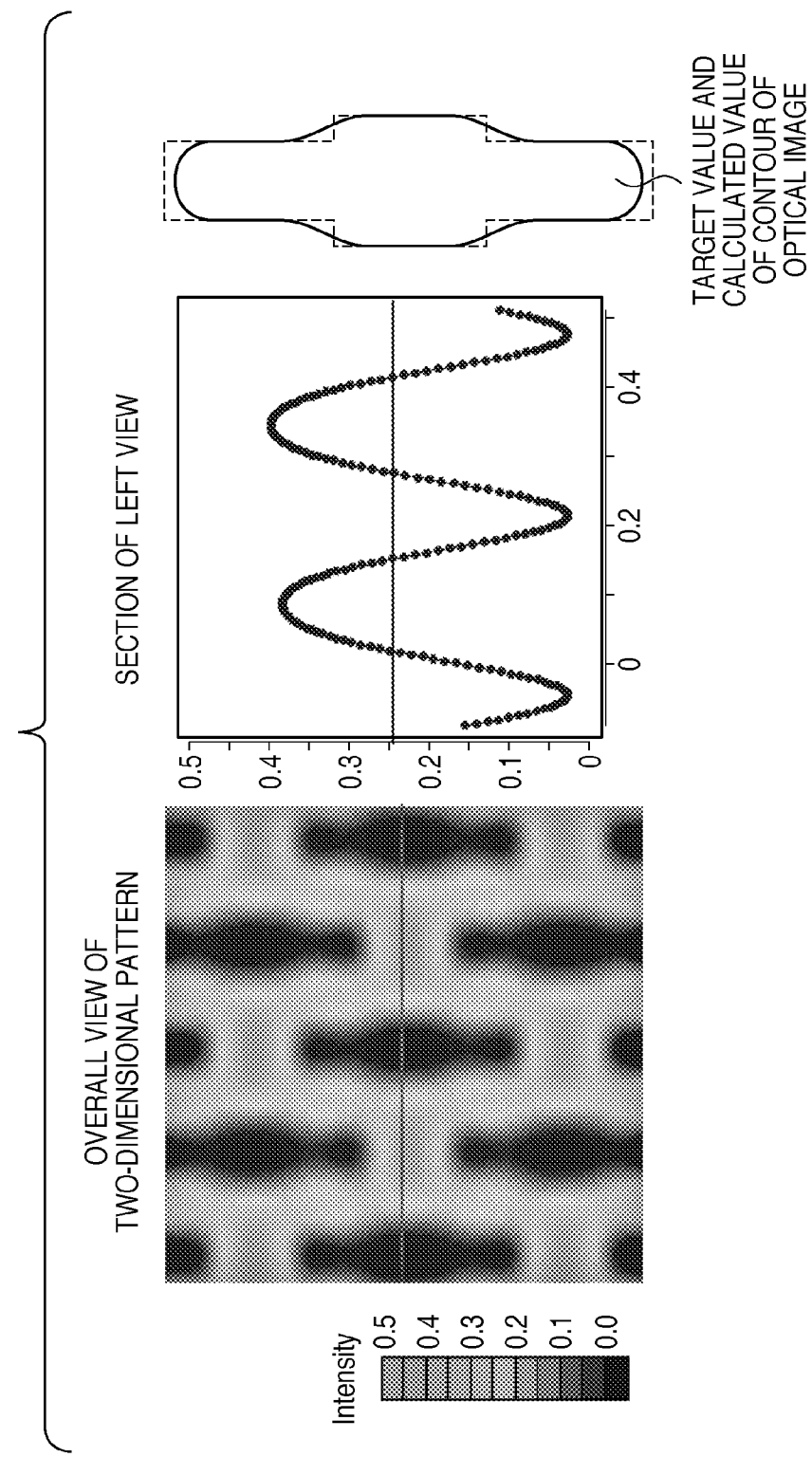
FIG. 4 is a view showing the intensity distribution of a pattern optical image.

The exposure amount is represented by the energy per unit area in an experiment, whereas it is represented by the intensity of an optical image formed on the image plane in simulation. The intensity of an optical image is normalized assuming that the standard intensity is 1 and takes values from 0 to 1. The dimension of the optical image at a position where it is sliced at a certain value is determined as the pattern dimension. FIG. 4 shows this mechanism. The pattern contour of the reticle 26 on the substrate 29 can be obtained by two-dimensionally performing this operation.

To optimize the illumination condition, it is necessary to designate the value of the exposure amount, that is, the final dimension of each portion on a pattern because the optimization result changes depending on it. The pattern in this case is one optimization target pattern or a reference pattern such as a line & space (L/S) pattern.

Figure 5:
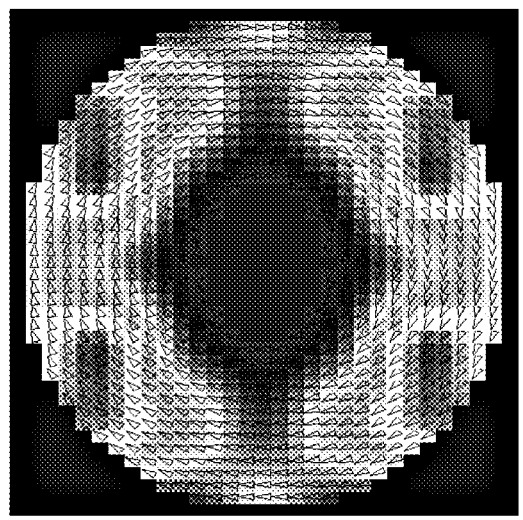
FIG. 5 is a view showing an illumination condition obtained by changing the intensity at each division point.
Figure 6:
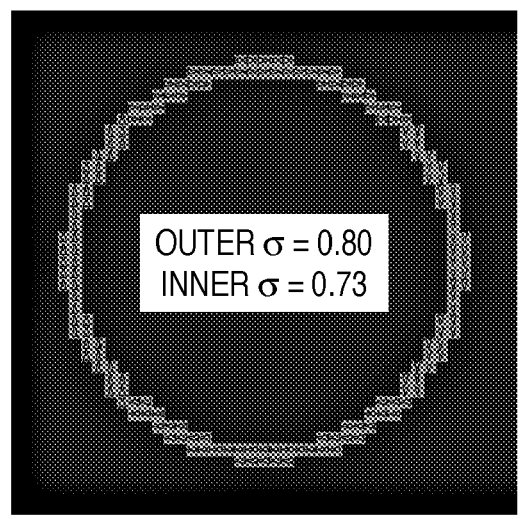
FIG. 6 is a view showing annular illumination.

To detect the illumination condition, there are a method of dividing the entire illumination region and changing the intensity at each division point, thereby performing the detection (FIG. 5), and a method of, when the illumination shape is limited as in annular illumination, changing the numeric values of numerically representable factors such as the inner and outer coherence factors σ, thereby performing the detection (FIG. 6).

Although an optical image is used to calculate the contour of the pattern on the substrate 29 in the above-described method, a resist image needs to be calculated in pattern matching because the resist image and the optical image are generally different from each other. A resist image may be calculated using either an approach of calculating a resist image by physically precise calculation, or an approach of calculating a resist image from a correlation between the measured value of the resist image and the calculated value of an optical image. The former approach has the demerit of requiring a long calculation time, so the latter approach which allows high-speed calculation and has a feature to be described later is used in this embodiment.

Figure 7:
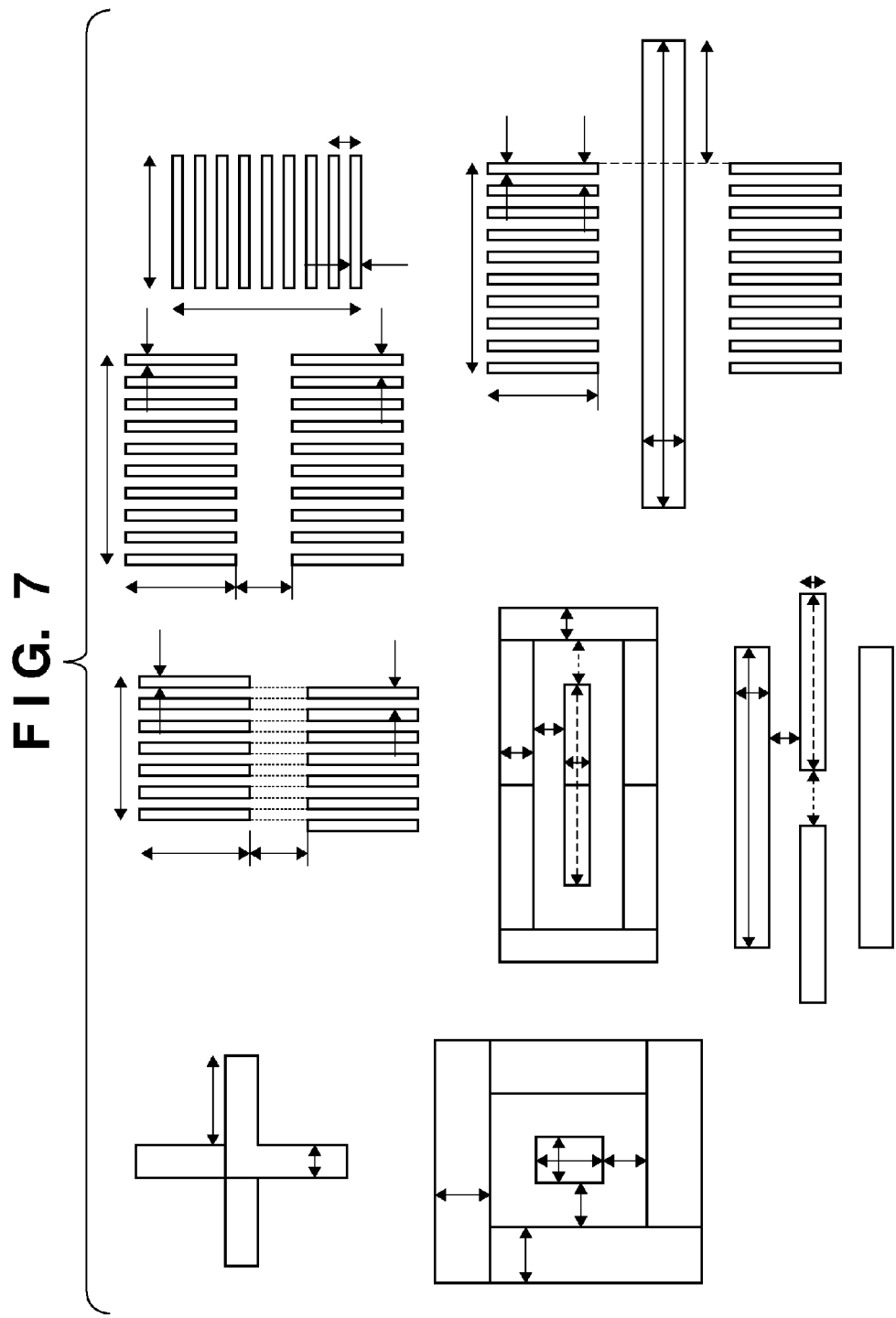
FIG. 7 is a view showing a test pattern.

The method of calculating a resist image will be explained herein. First, several types of test patterns which serve to extract models as shown in FIG. 7 are selected as patterns to be transferred and measured. The test patterns are included in the test reticle 26. Although only several types of test patterns are used, they each have several tens to several hundreds of line widths, space widths, and line end widths. The image log slopes (ILSs) and the curvatures are calculated at important points on these test patterns from their optical images.

The ILSs are defined by:

$$ILS = d\ln(I)/dx$$

where I is the light intensity, and x is the position.

Figure 8:
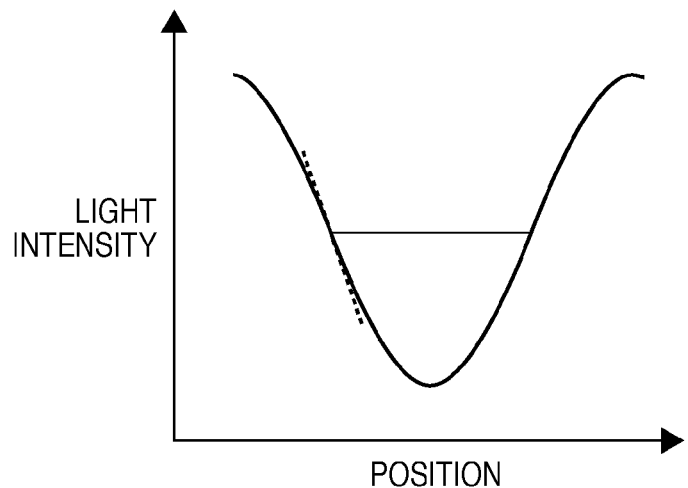
FIG. 8 is a graph for explaining how to obtain the ILS.
Figure 9:
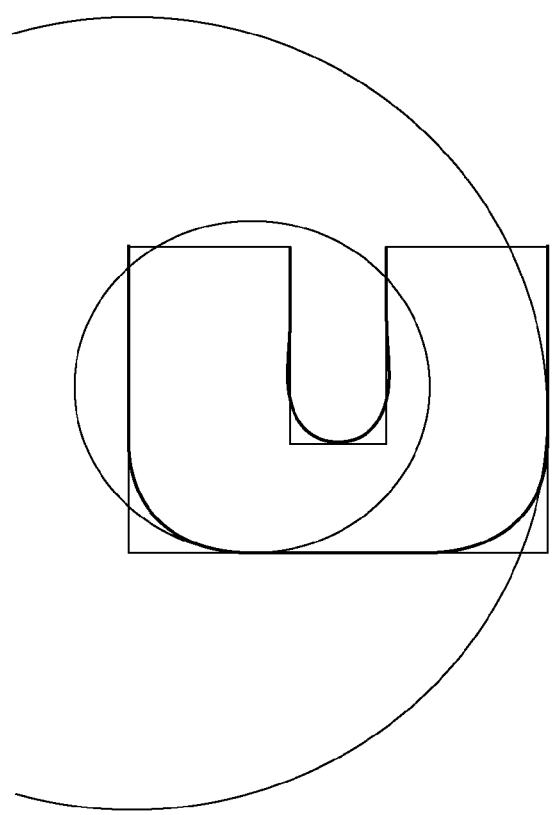
FIG. 9 is a view for explaining how to obtain the curvature.

The curvatures are calculated by dividing the contour into small curves, fitting them by parts of circles, and determining the radii of the circles as the curvatures. FIGS. 8 and 9 show detailed examples of the ILSs and the curvatures, respectively.

A difference δ between the calculated value of an optical image and the measured value of a resist image formed on a photosensitive agent applied on the substrate 29 at each of the important points is expressed by:

$$\delta = a*\text{curvature} + b*ILS + c$$

where a, b, and c are constants.

These values are fitted at all evaluation points to determine the constants a, b, and c. Construction of this relation which defines the relationship between the measured value and the calculated value is commonly called model construction. When the model is determined, the above-mentioned difference is determined by calculating the ILS and the curvature from the optical image at an arbitrary position on the pattern, and the pattern dimension of a resist image used in place of the optical image is then calculated.

Figure 10:
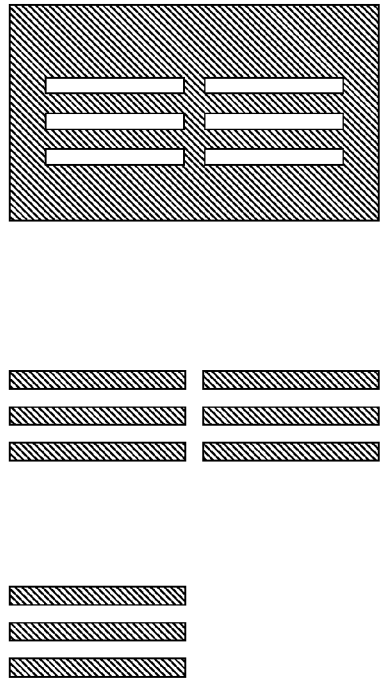
FIG. 10 is a view showing that the ILS and the curvature can be used to construct a general-purpose model.
Figure 10:
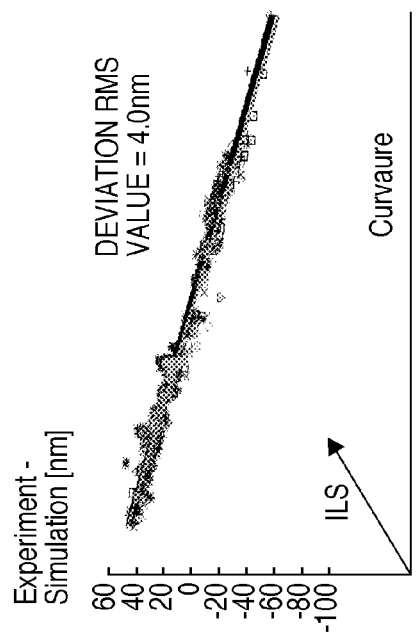
Figure 11:
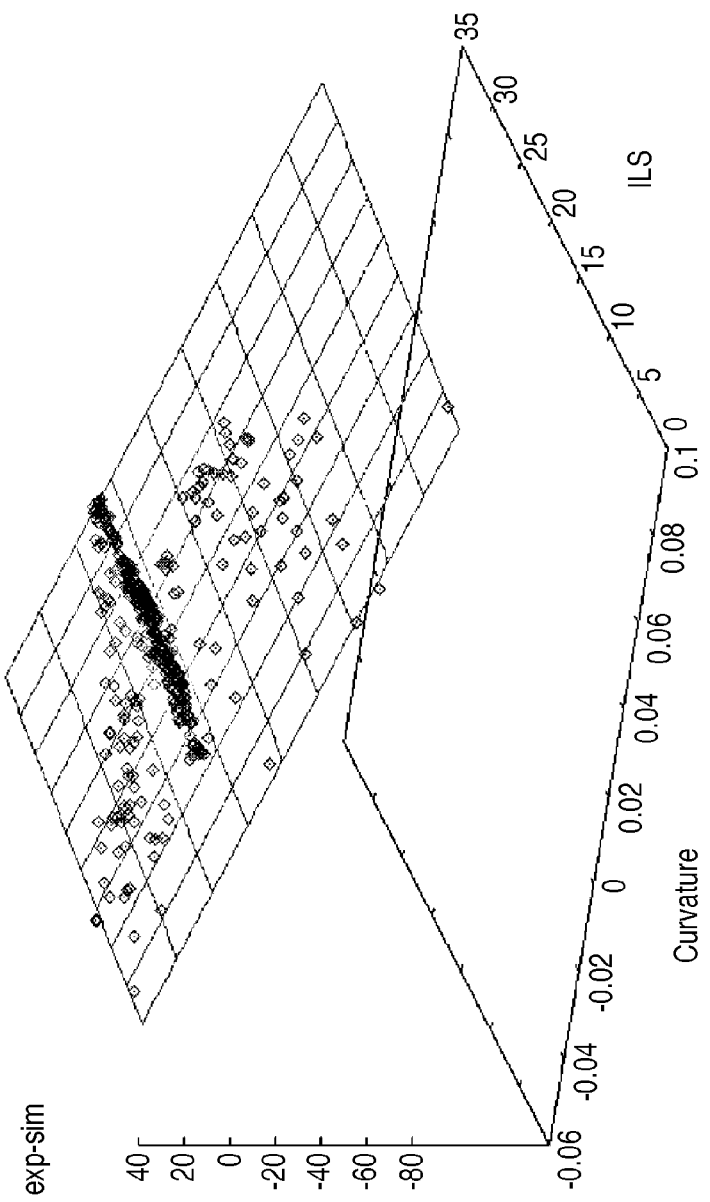
FIG. 11 is a perspective view of FIG. 10.

Although an exemplary resist image calculation scheme has been described above, when a correlation with the measured value of a resist image is calculated, the illumination condition is limited because the transfer and measurement of the pattern of the resist image take a lot of time. However, in this embodiment, even under an illumination condition other than that under which a model is generated in order to detect an optimum illumination condition, the model must be valid. To meet this need, the following technique is exploited in the model generation in this embodiment. When the relationship between the measured value of a resist image and the calculated value of an optical image is defined, there exist various physical quantities, which represent the features of the optical image, such as the light intensities at brightest and darkest positions near the evaluation point or their ratio. However, the results of various kinds of evaluations proved that the ILS and the curvature can be used to construct a general-purpose model corresponding to a wide variety of illumination conditions. FIGS. 10 and 11 show the versatility of the ILS and the curvature. Note that an experiment was conducted for three model extraction patterns under seven exposure conditions to construct a model, which uses the ILS and the curvature as variables, based on the result of experiment #1. The results obtained by other exposure parameters are plotted in the model equation. Almost all data on these results fall within one plane defined by the ILS and the curvature, revealing that the model is valid for a wide variety of exposure parameters.

Although the ILS is used as the index of the optical image herein, the NILS (Normalized ILS) which derives from the ILS may be used and is defined by:

$$NILS = CD(d\ln(I)/dx)$$

where I is the light intensity, x is the position, and CD is the target dimension.

Figure 12:
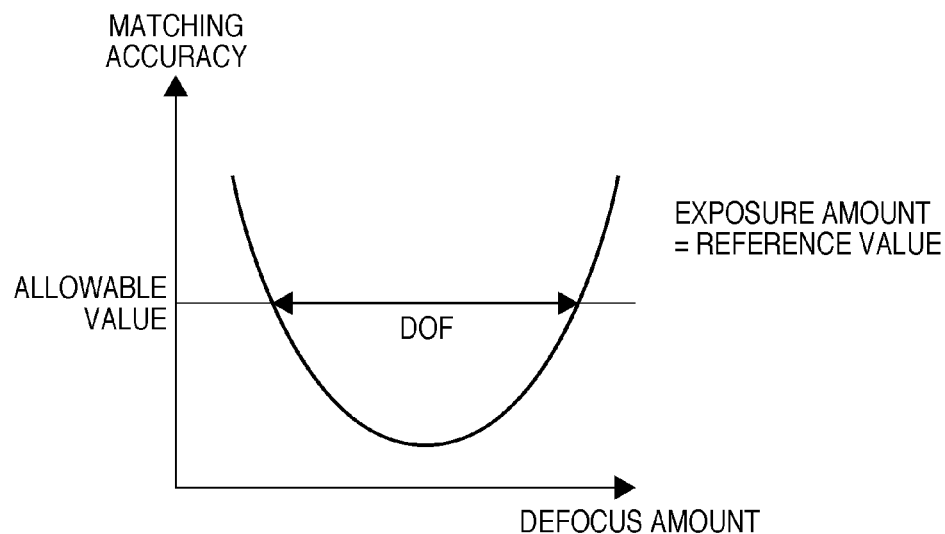
FIG. 12 is a graph for explaining how to obtain the matching DOF.

Although the degrees of freedom of the exposure amount and defocus amount are taken into consideration in the above description, only the degree of freedom of the defocus amount may be taken into consideration because the defocus amount generally has a degree of freedom much smaller than that of the exposure amount (FIG. 12). It is also possible to take into consideration only the degree of freedom of the exposure amount, as a matter of course. This degree of freedom will be referred to as the matching DOF for the sake of convenience of description to be given hereinafter. An example in which the matching DOF is obtained will be shown herein.

Figure 13:
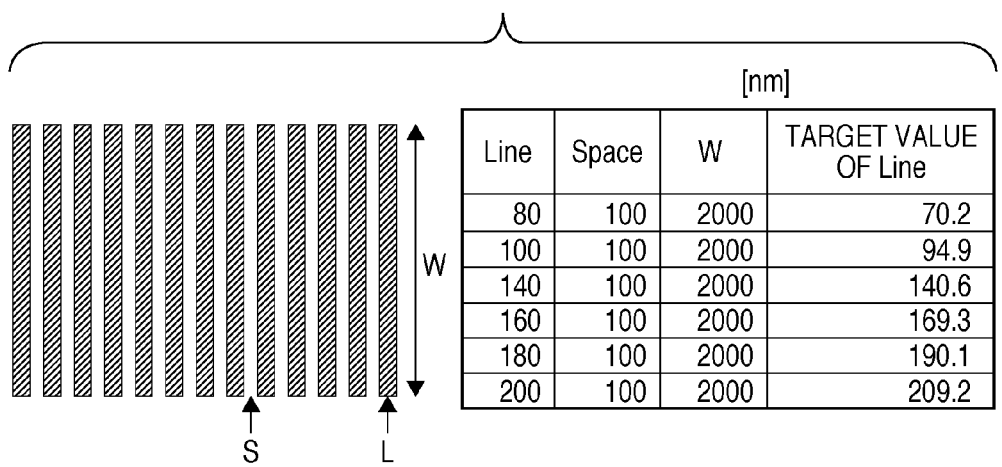
FIG. 13 is a view showing a pattern to match.

FIG. 13 shows a test pattern to match. In this case, an L/S pattern is used instead of a device pattern. Six types of such patterns are used to optimize the illumination condition so that the central line widths of the respective patterns become target values. The target values are described in the table shown in FIG. 13. The exposure conditions include a wavelength of 193 nm, a 6%-halftone mask, and non-polarization, and an optimum solution of the exposure parameter is obtained in annular illumination. FIG. 14 shows the result obtained by the conventional method. FIG. 14 reveals that a matching accuracy as high as a deviation RMS value=3.16 nm can be obtained when an outer σ=0.915 and an inner σ=0.889 are set by five optimization trials. In contrast, FIG. 15 shows the result obtained by taking account of the DOF in this embodiment. FIG. 15 reveals that a matching DOF=173 nm can be obtained for an allowable value=5 nm of the deviation RMS value when an outer σ=0.68 and an inner σ=0.637 are set by three optimization trials.

Figure 16:
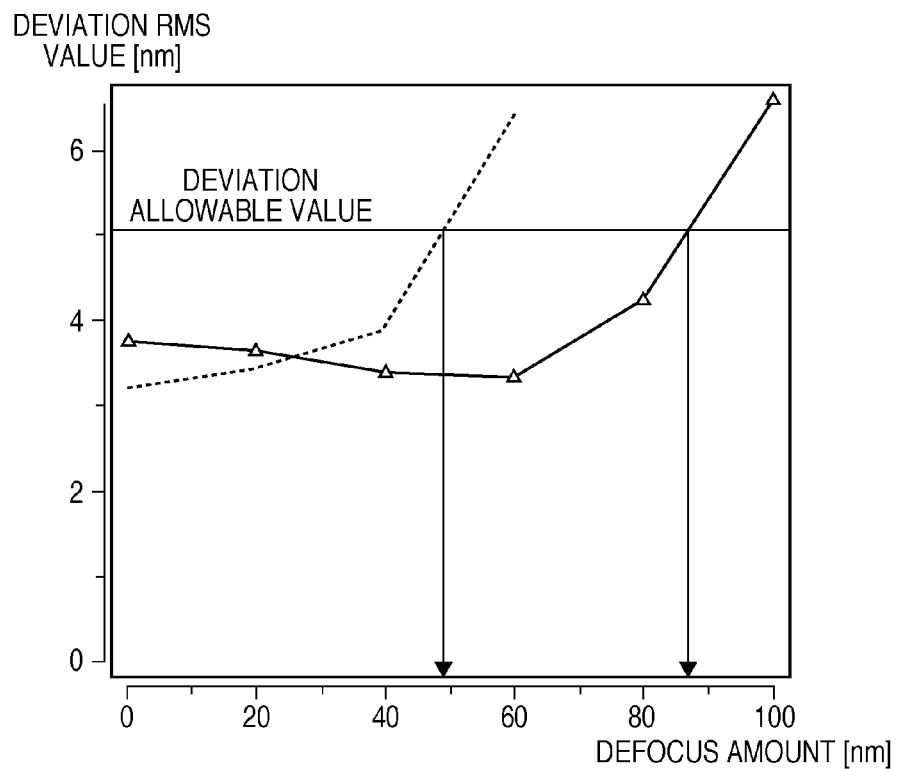
FIG. 16 is a graph showing the conventional pattern matching vs. the pattern matching according to the first embodiment.

FIG. 16 shows the result obtained by the conventional matching method vs. that obtained by the matching method according to this embodiment. FIG. 16 shows the deviation RMS value at each defocus amount. In FIG. 16, a dotted line indicates the result obtained under the illumination condition calculated by the conventional matching method, and a solid line indicates the result obtained under the illumination condition calculated by the matching method according to this embodiment. Although there exist the positive and negative defocus directions, the matching accuracy is evaluated only based on the defocus amount in the positive direction. If the threshold of the deviation RMS value is assumed to be 5 nm, the defocus allowable range is up to 50 nm in the prior art, whereas it is up to 90 nm in this embodiment.

That is, in the conventional matching method, the matching accuracy is high at a best focus position but degrades rapidly upon defocus. In contrast, the matching method according to this embodiment has a feature that a defocus range which is less than the upper limit of the RMS standard is wide although the matching accuracy is inferior at a best focus position. Since the upper limit of the RMS value falls within the compensation range of a device characteristic upon practical application to a device pattern, the matching method according to this embodiment can form a device pattern with a higher accuracy, making it possible to improve the device manufacturing yield.

Figure 23:
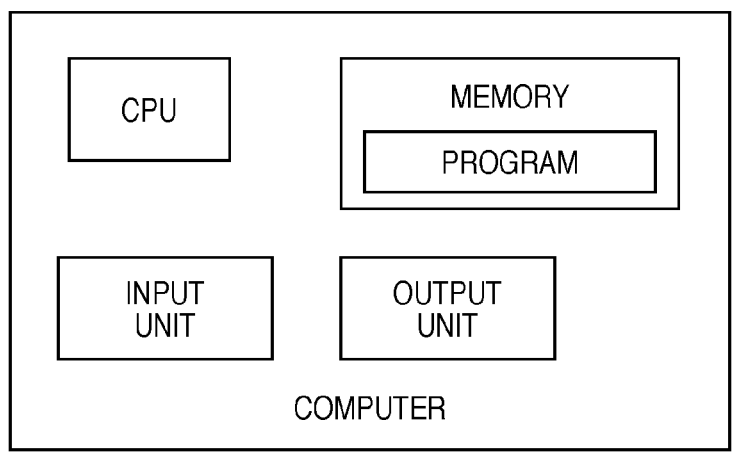
FIG. 23 is a block diagram showing the configuration of a simulator.

FIG. 23 is a block diagram illustrating an example of a simulator which calculates an optical image and a resist image to determine optimum exposure conditions. The simulator can be configured by installing a computer program for causing a computer to execute processes involved. The program can include codes (commands) which cause the computer to execute an obtaining step, a calculation step, and a determination step corresponding to the process of obtaining an optical image, the process of calculating the factor value ranges, and the process of determining the value of an exposure parameter, respectively. The computer includes, for example, a CPU, a memory (e.g., a DRAM or a hard disk), an input unit (e.g., a keyboard, a communication interface, or a media reader), and an output unit (e.g., a display, a memory, or a communication interface). The computer program, for example, can be loaded into the computer via the input unit and written in the memory in a predetermined format. It is possible to construct a model which defines the relationship between the measured value of an optical image and the calculated value of an optical image using this simulator to obtain an optical image by calculation using the constructed model.

Figure 17:
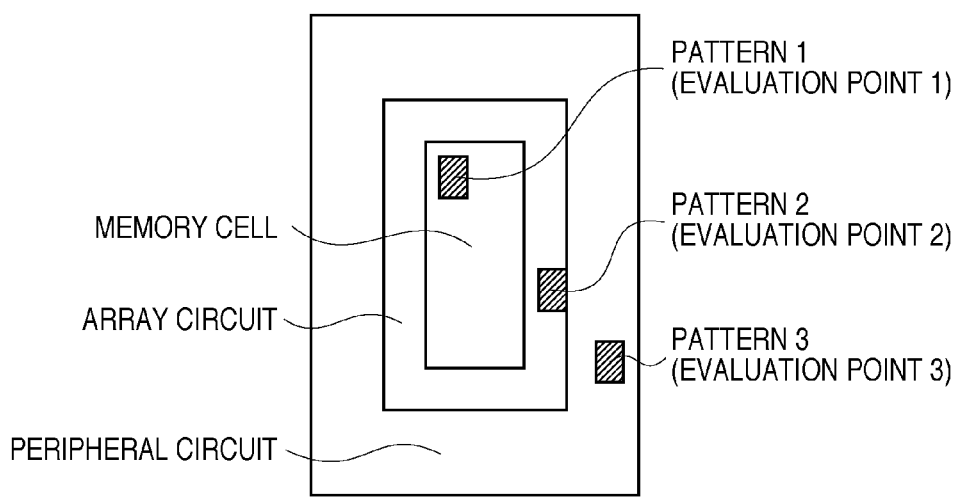
FIG. 17 is a view illustrating an example in which a plurality of patterns is used for pattern matching.

Pattern matching may be performed for only one pattern or for a plurality of patterns. In one concrete example, a plurality of important patterns is selected from a memory cell, an array circuit, and a peripheral circuit in a memory device (FIG. 17).

Figure 18:
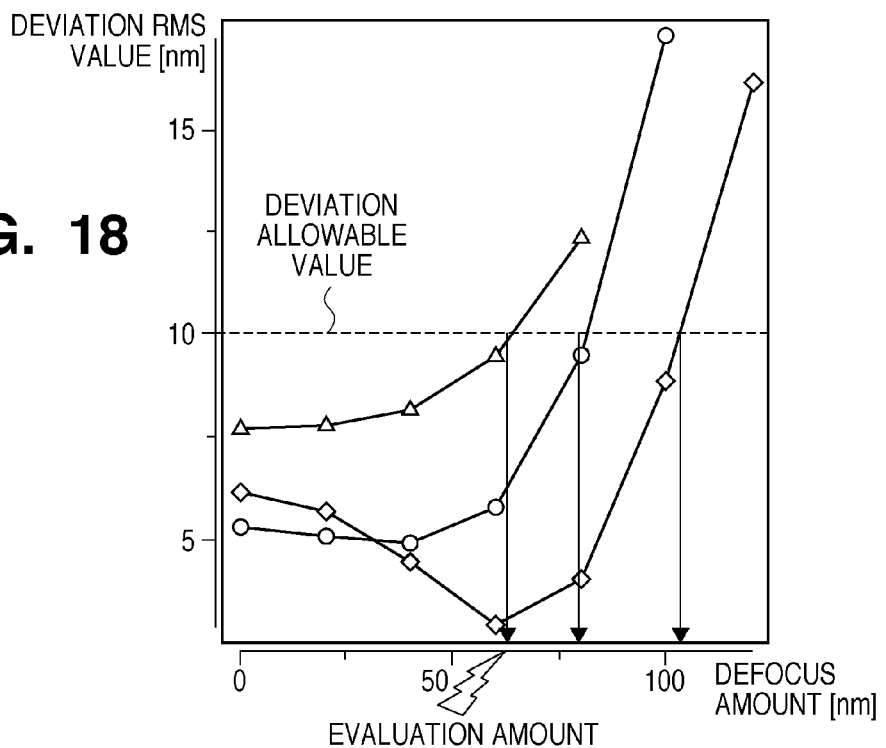
FIG. 18 is a graph illustrating an example in which the method according to the first embodiment is applied to a plurality of patterns.
Figure 19:
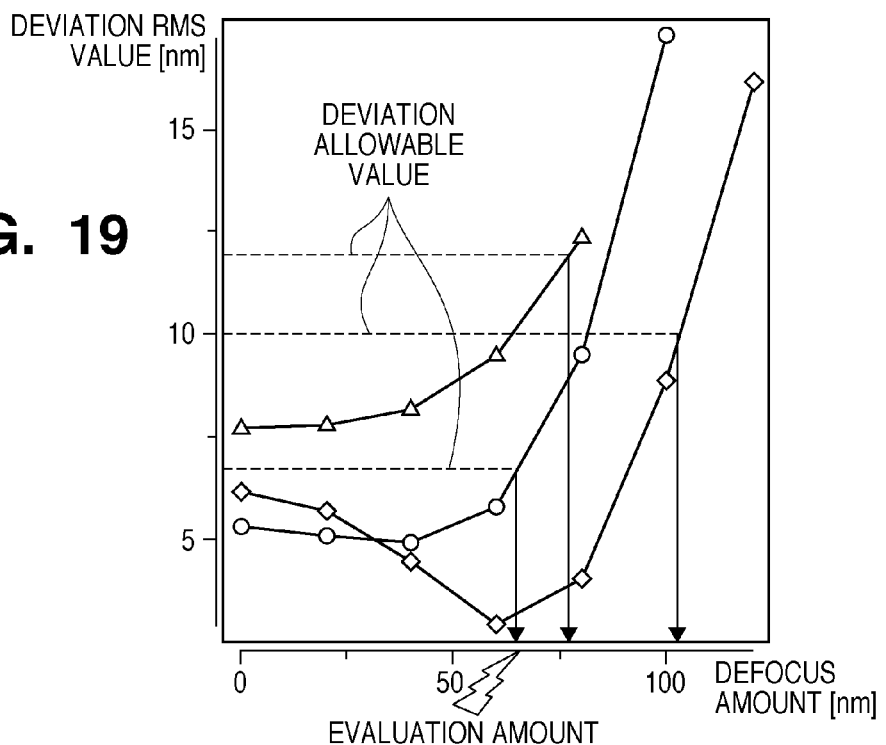
FIG. 19 is a graph illustrating another example in which the method according to the first embodiment is applied to a plurality of patterns.

FIGS. 18 and 19 show the results obtained by applying the matching method according to this embodiment to three patterns. Lines connecting Δ, ○, and ◇ marks correspond to patterns 1, 2, and 3, respectively. In the example shown in FIG. 18, a common deviation allowable value is set for the three patterns. On the other hand, in the example shown in FIG. 19, individual deviation allowable values are set for the three patterns.

In an exposure method of transferring the pattern of a reticle 26 onto a substrate 29 via a projection optical system 28 to expose a substrate 29, the value of the exposure parameter determined using the determination method according to this embodiment is set for an exposure apparatus. The substrate 29 is exposed using the exposure apparatus having the exposure parameter set.

When pattern matching is performed for a plurality of patterns, a method of grouping dimension errors at all evaluation positions on all patterns into one set, and optimizing the index value obtained based on the set has been conventionally employed. The index value of an optimum solution obtained for all the patterns by the conventional matching method is often poor when attention is paid to a certain pattern alone. FIG. 21 shows one example of this situation. A matching error is the deviation amount [nm] herein. In this example, the overall deviation RMS value is 1.48 nm, which is good for a deviation allowable value of 2 nm. However, an error at evaluation position 1 in an array circuit is 3.5 nm, which is much larger than the target. In this case, the array circuit may malfunction.

In a second embodiment, the value of an exposure parameter appropriate for an exposure apparatus which exposes a substrate using a reticle 26 having a plurality of patterns with different features is determined. The index value can be the deviation RMS value or maximum value, the matching window, or the matching DOF described above.

Figure 20:
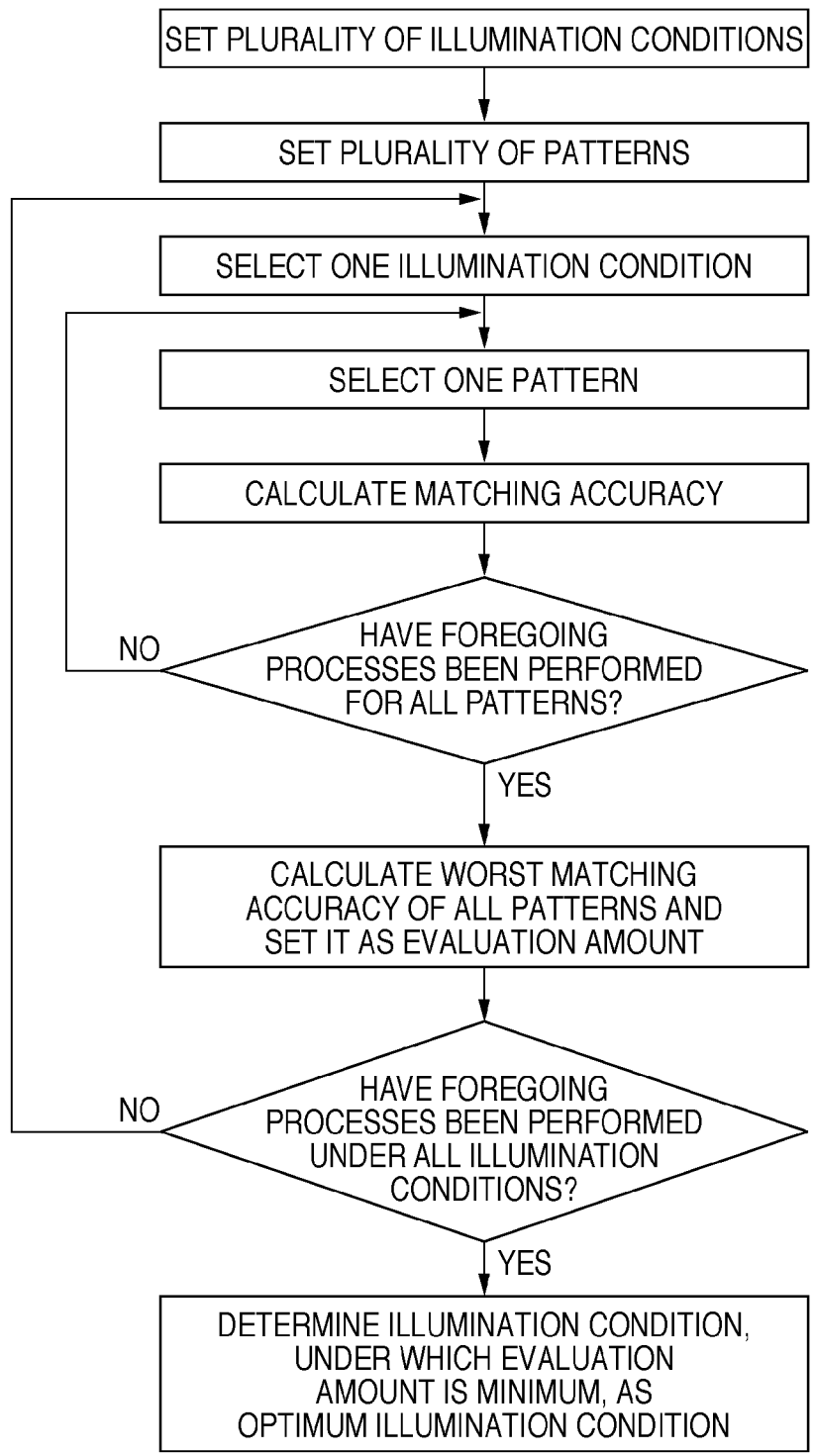
FIG. 20 is a flowchart showing a pattern matching method according to the second embodiment.

A method of obtaining the above-mentioned index for each pattern and determining the worst value of the obtained indices as an optimization index will be described in this embodiment. FIG. 20 is a flowchart showing this method. First, a plurality of illumination conditions and a plurality of patterns are set. A genetic algorithm, a Monte Carlo method, or the like can be used in the setting of illumination conditions. The matching accuracy is calculated for each of the plurality of patterns under a certain illumination condition, using an optical image or resist image on the surface of the substrate 29, and the worst matching accuracy of all the patterns is set as an index value for evaluating the certain illumination condition. The same operation is performed under all of the plurality of illumination conditions to determine an illumination condition under which the index value is minimum as an optimum illumination condition. If the matching window or the matching DOF is targeted, an illumination condition under which the index value is maximumal is determined as an optimum illumination condition.

Because this method judges which pattern shows poor matching accuracy, this makes it clear how to adjust the illumination condition and facilitates the attainment of an optimum solution as compared with the conventional method. When a device characteristic is taken into consideration as above, the method according to this embodiment can be selected if the pattern is functionally divided, instead of aimlessly balancing the entire pattern.

An exemplary method of manufacturing devices such as a semiconductor integrated circuit device and a liquid crystal display device using the above-mentioned exposure apparatus will be explained next.

The devices are manufactured by a step of transferring by exposure a pattern formed on a reticle 26 onto a substrate 29 using the above-described exposure method, a step of developing the exposed substrate 29, and other known steps of processing the developed substrate 29. The other known steps include, for example, etching, resist removal, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-153398, filed Jun. 11, 2008, which is hereby incorporated by reference herein in its entirety.

What is claimed is:

1. A method of determining a value of an exposure parameter when an image of a plurality of types of patterns formed on a reticle are transferred onto a substrate by exposure, the method being executed by a computer, the method comprising:

setting a value of the exposure parameter;

calculating an optical image of the plurality of types of patterns for a plurality of values of at least one of an exposure amount and a defocus amount using the set value of the exposure parameter;

obtaining a range, of the values of at least one of the exposure amount and the defocus amount, within which a deviation between a contour of a target optical image and a contour of the optical image calculated in the calculating step is not more than an allowable value, for each of the plurality of types of patterns;

changing the exposure parameter and repeating the calculating step and the obtaining step using the changed exposure parameter; and determining a value of the exposure parameter, at which a minimum value among the ranges, calculated in each of the plurality of types of patterns using calculation results in the calculating step, the obtaining step and the repeating step, is maximum.

2. The method according to claim 1, wherein a resist image is obtained from the optical image by calculation using a model which defines a relationship between the optical image and a resist image formed on a photosensitive agent applied on the substrate in the obtaining step, and wherein a contour of the resist image is used in place of a contour of the optical image in the calculating step.

3. The method according to claim 1, wherein individual allowable values of the deviation are different for the plurality of types of patterns.

4. A computer configured to execute the method of claim 1.

5. A non-transitory recording medium storing a computer program for causing a computer to determine a value of an exposure parameter when an image of a plurality of types of patterns formed on a reticle are transferred onto a substrate by exposure, the program comprising the steps of:

setting a value of the exposure parameter;

calculating an optical image of the plurality of types of patterns for a plurality of values of at least one of an exposure amount and a defocus amount using the set value of the exposure parameter;

obtaining a range, of the values of at least one of the exposure amount and the defocus amount, within which a deviation between a contour of a target optical image and a contour of the optical image calculated in the calculating step is not more than an allowable value, for each of the plurality of types of patterns;

changing the exposure parameter and repeating the calculating step and the obtaining step using the changed exposure parameter; and determining a value of the exposure parameter, at which a minimum value among the ranges, calculated in each of the plurality of types of patterns using calculation results in the calculating step, the obtaining step and the repeating step, is maximum.

* * * * *